United States Patent [19]

Sakai et al.

[11] Patent Number: 4,599,603
[45] Date of Patent: Jul. 8, 1986

[54] COMPRESSION TYPE A/D CONVERTER

[75] Inventors: Shinji Sakai; Akira Ishizaki; Takashi Kawabata, all of Kanagawa, Japan

[73] Assignee: Canon Kabushiki Kaisha, Tokyo, Japan

[21] Appl. No.: 597,453

[22] Filed: Apr. 5, 1984

[30] Foreign Application Priority Data

Apr. 15, 1983 [JP] Japan .................................. 58-65184

[51] Int. Cl.⁴ ............................................. H03M 1/12
[52] U.S. Cl. ........................ 340/347 AD; 340/347 M
[58] Field of Search ................................. 340/347 AD

[56] References Cited
PUBLICATIONS

Analog-To-Digital, Digital-To-Analog Conversion Techniques, D. F. Hoerchele, Jr., Wiley 1968, pp. 381–384.

Primary Examiner—William M. Shoop, Jr.
Assistant Examiner—Saul M. Bergmann
Attorney, Agent, or Firm—Toren, McGeady, Stanger, Goldberg & Kiel

[57] ABSTRACT

A compression type A/D converter for producing an output in the form of a digital value almost equal to the square root of the input analog value. For this purpose, the A/D converter is constructed as a dual-slope A/D converter in which the current signal for inverse integration increases as a function of a polynominal of order n (n=1) of the inverse integration period.

4 Claims, 5 Drawing Figures

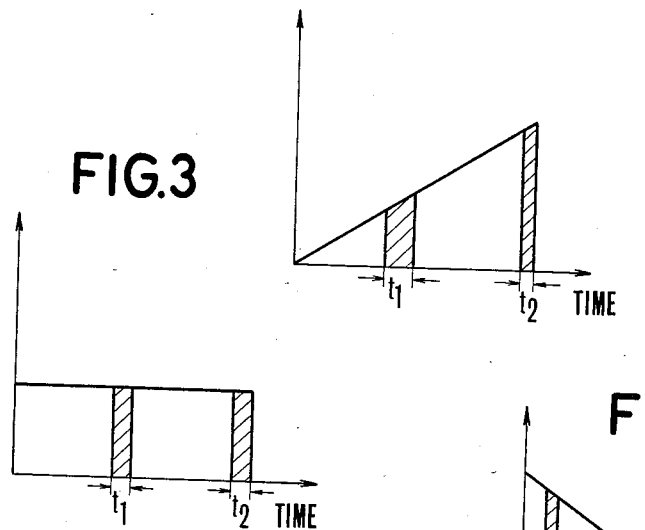
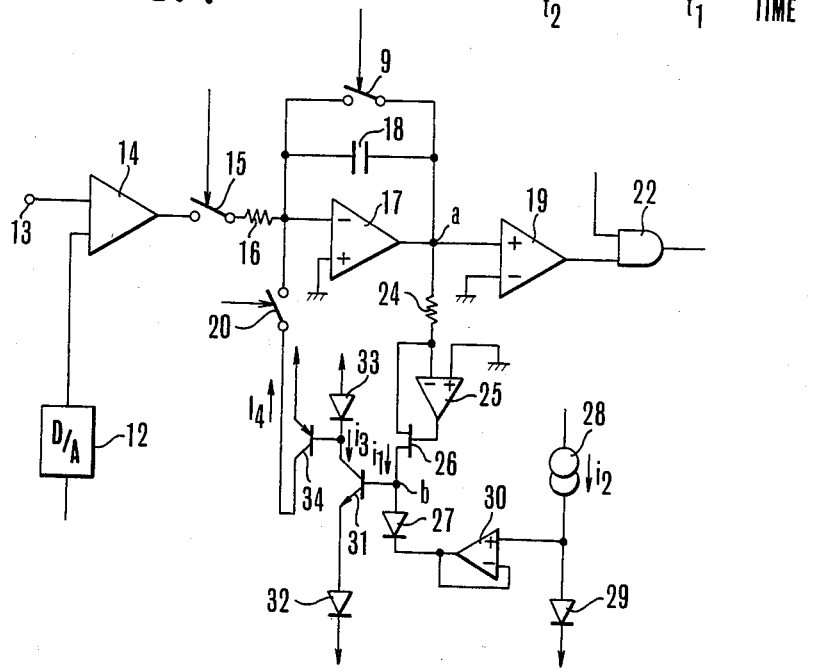

COMPRESSION TYPE A/D CONVERTER

BACKGROUND OF THE INVENTION

1. Field of the Invention

This invention relates to A/D converters using a dual slope integration circuit and, more particularly, to such A/D converter which is constructed so as to produce a digital signal proportional to the square root of the input signal.

2. Description of the Prior Art

For obtaining an A/D converted value in the compressed form, conventionally there have been practised two different ways; the analog value after having been compressed by an analog compression circuit is converted to a digital value, or the analog value is merely converted to a digital value which is then compressed by computation. In the former case, however, the circuit becomes complicated. In the latter case, it takes a long time and the dynamic range is narrowed, so that the required accuracy cannot be obtained.

On this account, in the case of using the dual-slope A/D converter, the inverse-integrated current generating means can be provided with control means for changing the inverse integration current in such a way that the inverse integrated charge amount increases exponentially as the inverse integration time increases. The dual-slope A/D converter having such input response output characteristic with the logarithmic compressing function is disclosed in FIG. 4 of U.S. Pat. No. 4,377,742.

In another case where the analog quantity is a square function of a given parameter, for example, the consumed electrical power varying as a square function of the supplied voltage is used and the supplied voltage is to be found digitally from the consumed electrical power, and the density of the photographic negative as a square function of the brightness is used and the brightness is to be found from the density of the negative, there have been two methods, one of which is that after the mere analog-to-digital conversion of the consumed electrical power or the density of the negative, the digital signal is compressed, and another method which is that the consumed electrical power or the density of the negative while being in the form of an analog signal, is compressed and the A/D conversion then follows. By the former method, it takes a long time to compress the digital signal, and, because the dynamic range of the consumed electrical power or the photographic density is very wide, it also takes another long time to perform the A/D conversion.

Even in the latter method, there is an alternate drawback in that the circuit for compressing the analog signal becomes complicated.

SUMMARY OF THE INVENTION

A first object of the present invention is to provide an A/D converter for producing an output in the form of a digital value equal to the square root of the value of an analog input thereof, which converter has overcome the above-described drawbacks of the conventional one, and in which the circuitry is constructed in a simple form, the time necessary to perform the conversion can be shortened, and the dynamic range can be widened.

Under with respect to such object, the present invention is intended to provide for the inverse integration current generating means in the dual-slope A/D converter with control means for changing the reverse integration current in such a way that the amount of inverse-integrated charge increases as almost a square function of the inverse integration time, which constitutes a second object of the invention.

BRIEF DESCRIPTION OF THE DRAWINGS

FIG. 2 is a graph illustrating a characteristic curve of the inverse integration current appearing in the circuit of FIG. 1.

FIG. 3 is a characteristic curve of the inverse integration current in the conventional dual-slope integration type A/D converter.

FIG. 4 is a fragmentary electrical circuit diagram illustrating another embodiment of the invention.

FIG. 5 is a characteristic curve of the inverse integration current in the circuit of FIG. 4.

DETAILED DESCRIPTION OF THE PREFERRED EMBODIMENTS

Figure 1:
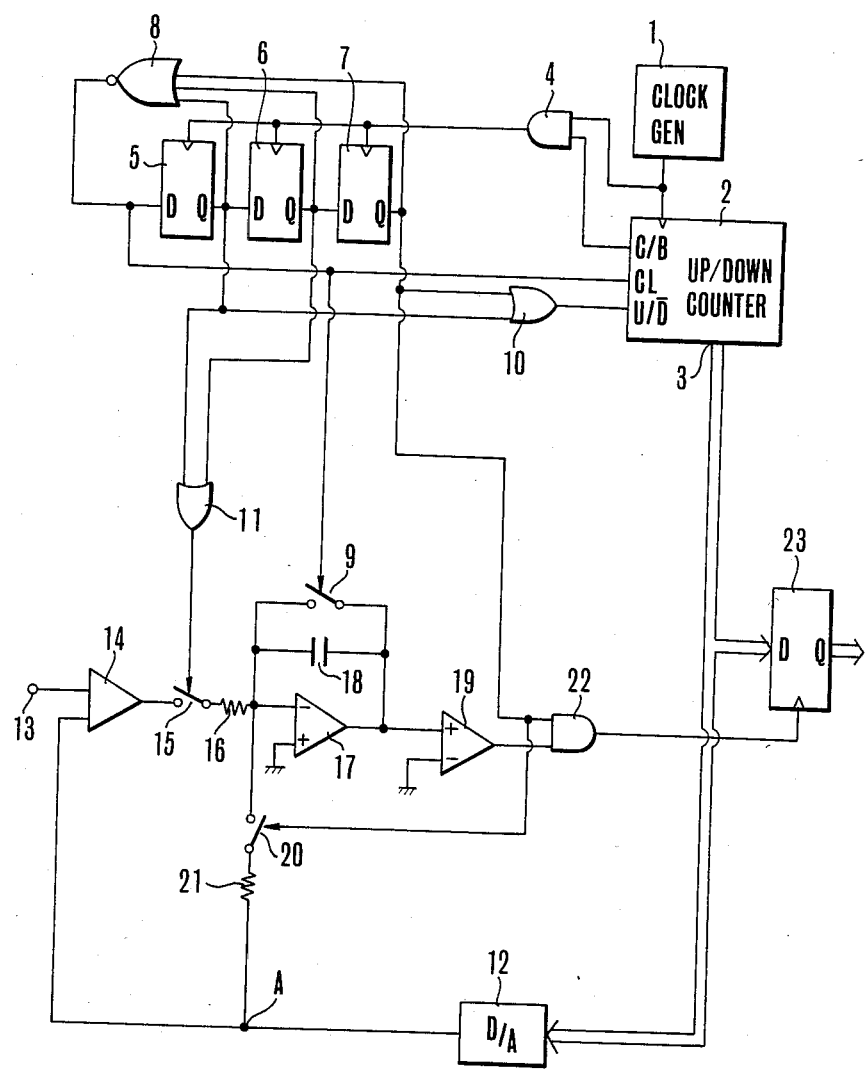
FIG. 1 is an electrical circuit diagram illustrating an embodiment of the invention.

The circuit of FIG. 1 includes a clock generator 1, an up-or-down counter 2 having a carry-or-borrow terminal C/B, a clear terminal CL, an up-and-down selecting input terminal U/$\overline{D}$ and an output terminal 3 at which an output representing the number of counts corresponding to a time for integrating the input signal appears, taking high level when the counter operates either in up mode, or in down mode, or produces a borrow, an AND gate 4, three D-flip-flops 5, 6 and 7, a NOR gate 8, a reset switch 9 having an ON state when the NOR gate 8 produces a signal of high level, two OR gates 10 and 11, a D/A converter 12 for converting the number of counts from the U/D counter 2 to a negative analog value, an inlet 13 to which is applied an analog voltage, a multiplier 14 for multiplying the analog voltage from the inlet 13 and the negative analog value of the D/A converter 12 to produce an output in the form of a positive analog voltage, a sampling switch 15 having an ON state when a signal of high level is applied thereto from the OR gate 11, and a resistor 16 constituting an integration circuit together with an operational amplifier 17 and a capacitor 18. As the charge stored on the capacitor 18 is inverse-integrated, when an initial condition is reached, a comparator 19 produces an output signal of high level. When a signal of high level is applied from the D-flip-flop 7 to an inverse integration control switch 20, it turns on. A resistor 21, and AND gate 22 and a D-flip-flop 23 are additionally included.

The operation of the circuit is as follows:

At first, by a power-up clear circuit (not shown) all the illustrated flip-flops are reset when an electrical power source is thrown. Therefore, any of the D-flip-flops 5, 6 and 7 is in the "reset" state, producing a signal of low level at an output terminal Q thereof. Responsive to these signals, NOR gate 8 produces an output signal of high level which is applied to the clear terminal CL of U/D counter 2 and the reset switch 9, thereby the counter 2 is cleared of the preceding content and the "reset" switch 9 is turned on to clear the charge from the capacitor 18. Since, at the same time, the output terminals Q of the D-flip-flops 5 and 7 produce signals of low level, the OR gate 10 then produces a signal of low level which is applied to the up-and-down selection control terminal U/$\overline{D}$, thereby the U/D counter 2 is rendered to operate in the down count mode. Since, at this time, the content of U/D counter 2 is zero, a borrow signal of high level is applied from the carry-or-borrow terminal C/B to the AND gate 4, thereby the AND gate 4 is opened, allowing clock pulses from the clock pulse generator 1 to pass to the D-flip-flops 5, 6 and 7 therethrough. Responsive to the first clock pulse, the D-flop-flop 5 changes its output to high level, while the outputs of the D-flop-flops 6 and 7 remaining low level. Therefore, the NOR gate 8 changes its output to low level, and then the clearing of the U/D counter 2 is released, and the "reset" switch 9 is turned off to release the clearing of the capacitor 18. At the same time, the OR gate 10 changes its output to high level and the signal of high level is then applied to the up-and-down selection control terminal U/$\overline{D}$ counter 2. Thus, the U/D counter 2 starts to count up. Also since, at this time, the output of the OR gate 11 changes to high level, the sampling switch 15 turns on and then the positive analog voltage from the multiplier 14 is applied to and stored on the capacitor 18 as a charge through the resistor 16. It is to be noted that this up-counting is continued until the U/D counter 2 produces a "carry" signal of high level.

When the "carry" signal of high level is produced from the carry-or-borrow terminal C/B, the AND gate 4 opens, allowing a clock pulse from the clock generator 1 to enter the D-flip-flops 5, 6 and 7. Thereby the output of the D-flip-flop 5 is changed to low level, the output of the D-flip-flop 6 to high level, and the outputs of the D-flip-flop 7 and NOR gate 8 remain low level. Therefore, the output of the OR gate 10 becomes low level so that the U/D counter 2 starts to count down. Since, at this time, the output of the OR gate 11 remains high level, the sampling switch 15 continues to be ON. As the U/D counter 2 counts down, the analog output of the D/A converter 12 is decreasing, while being multiplied by the analog voltage from the input terminal 13, and the output of the multiplier 14 is being integrated. It is to be noted that this counting down continues to operate until a "borrow" signal is produced from the carry-or-borrow terminal C/B of the U/D counter 2.

When the "borrow" signal is produced, the AND gate 4 opens the clock pulses from the generator 1 enter the D-flip-flops 5, 6 and 7. Thereby while the output of the D-flip-flop 5 remaining low level, the output of the D-flip-flop 6 changes to low level, and the output of the D-flip-flop 7 changes to high level. Therefore, the output of the OR gate 10 becomes high level so that the U/D counter 2 starts to count up. At the same time, the output of the OR gate 11 becomes low level, turning off the sampling switch 15.

During such process, a certain window function produced from the D/A converter 12 is sampled for a certain time in the multiplied form of the input analog voltage by the multiplier 14 and is stored as a charge on the capacitor 18. Therefore it is possible to perform accurate sampling free from the sudden change of the input at the initial and terminal points of the sampling operation.

Such change of the output of the D-flip-flop 7 to high level also causes the inverse integration control switch 20 to turn on. Then, the output of the D/A converter 12 is applied through the resistor 21 to the operational amplifier 17 and capacitor 18, serving as an inverse integration current flowing thereto. Thus, by the inverse integration current of which the intensity increases step-wise each time the U/D counter 2 counts up one pulse, the charge stored on the capacitor 18 is inverse-integrated. At the termination of duration of the inverse integration, or when the capacitor 18 reaches the initial charging position, the comparator 19 produces an output signal of high level. Since, at this time, the output of the D-flip-flop 7 is of high level, the AND gate 22 opens, allowing the signal of high level from the comparator 19 to pass the D-flip-flop 23 through it, thereby the D-flip-flop 23 is clocked latching the number of counts. Thus, the D-flip-flop 23 produces at its output terminal Q an output in digital form corresponding to the input analog voltage.

After that, the U/D counter 2 produces a "carry" signal of high level at the terminal C/B. Then, the AND gate 4 opens and the clock pulses from the generator 1 enter the D-flip-flops 5, 6 and 7. Thereby the outputs of the D-flip-flops 5, 6 and 7 each become low level, and at the same time the output of the NOR gate 8 becomes high level. And the initial position is regained.

In this embodiment, as illustrated in FIG. 2, the intensity of inverse integration current increases with time at almost constant a rate. Letting t1 denote the period necessary to inverse integrate a predetermined amount of charge with the starting point in time being taken when the inverse integration current is smaller, it follows that a period t2 necessary to inverse integrate the same amount of charge with the starting point taken when the inverse integration current is larger is far shorter than the period t1. In other words, for the constant inverse integration period, the amount of inverse-integrated charge increases as a square function of the starting time point. By this, the input analog voltage is compressed to its square root. On the other hand, when the intensity of inverse integration current is constant (see FIG. 3) as in the prior art, the required value of period for inverse integrating that predetermined amount of charge is always t1. Therefore, the amount of inverse-integrated charge increases as a linear function of the period. Thus, no compression takes place.

According to the foregoing embodiment of the invention, the window function generator comprising the U/D counter 2 and the D/A converter 12 is made to also serve as the inverse integration current generating means, thereby giving an advantage that the structure of the circuit can be very simplified.

FIG. 4 is an electrical circuit diagram illustrating another embodiment of the present invention in which the same reference characters have been employed to denote the similar parts to those shown in FIG. 1 with the ones of the parts which are not altered being omitted. There are shown a resister 24, an operational amplifier 25, a field effect transistor 26, a diode 27 and a constant current circuit 28. A voltage proportional to the logarithm (log) of the constant current appears across the two terminals of another diode 29. Another operational amplifier 30, another transistor 31, and another diodes 32 and 33 are included. The diode 33 constitutes a current mirror circuit together with another transistor 34. i1 denotes a current proportional to the voltage stored on the capacitor 18, i2 a constant current, and i3 a current proportional to the square root of the stored voltage.

When reverse integrating, the stored voltage appearing at a point, "a", is converted to the current i1 by the resistor 24, operational amplifier 25 and field effect transistor 26. By allowing the current i1 to flow through the diode 27, owing to the characteristics of the diode 27, a forward voltage that varies as a log function of the stored voltage is produced across the diode 27. Also by allowing the constant current i2 from the constant current circuit 28 to flow through the diode 29, a voltage corresponding to the log of the constant current value is produced across the diode 29, which is applied through the operational amplifier 30 to a point, "b". It is, therefore, at the point "b", that a voltage corresponding to the sum of the two logs appears and is equalized with two times the voltage proportional to the log of the current i3 flowing through the base-emitter path of the transistor 31. That is, the following relation holds for the currents:

$$\log i1 + \log i2 = 2 \log i3$$

$$\sqrt{i1 \cdot i2} = i3$$

What current i3 flows through the transistor 31 is found to be proportional to the square root of the stored voltage. This current i3 is made to invert by passing it through the current mirror circuit comprising the diode 32 and transistor 34, and the inverted current is allowed to flow through the inverse integration control switch 20 to the integration circuit.

This inverse integration current decreases in proportion to time as shown in FIG. 5. In more detail, letting Va denote the voltage at the point "a", C the capacitance of the capacitor 18, R the resistance of the resistor 24, Q0 the value of charge stored on the capacitor 18 measured at the start of inverse integration, or at a point in time when the inverse integration start switch 20 is turned on, Q(t) the value of charge stored on the capacitor 18 measured in "t" seconds from the closure of the switch 20, and I4(t) ($\approx$i3) the value of collector current of the transistor 34 measured in "t" seconds from the closure of the switch 20, we have the following equations:

$$Q(t) = Q0 - \int_0^t I4(t)dt$$

$$I4(t) \approx i3$$

$$i3 = \sqrt{i2 \cdot i1}$$

$$i1 = \frac{Va}{R} = \frac{Q(t)}{CR}$$

$$\frac{dQ(t)}{dt} = -I4(t)$$

By eliminating i1, i3 and i4(t) from four of the above equations we obtain the following equation for Q(t):

$$Q(t) = \left(\sqrt{Q0} - \frac{1}{2}\sqrt{\frac{i2}{CR}}\, t\right)^2$$

Therefore, the inverse integration current I4(t) becomes $$I4(t) = \sqrt{\frac{i2}{CR}}\left(\sqrt{Q0} - \frac{1}{2}\sqrt{\frac{i2}{CR}}\, t\right)$$

and decreases with time as illustrated in FIG. 5.

Here, at the termination of the inverse integrating operation, because the charge of the capacitor 18 becomes zero, the Q(t)=0. Therefore, $$t = 2\sqrt{\frac{CR}{i2}}\,\sqrt{Q0} \propto \sqrt{Q0}$$

So the inverse integration period is proportional to the square root of the charge Q0 of the capacitor 18 at a point in time when the inverse integration start switch turns on. That is, the input analog voltage is compressed to its square root.

According to this embodiment, the A/D converter of the invention is constructed as by adding to the prior known dual-slope integration type A/D converter a means for generating an inverse integration current of intensity proportional to the square root of the voltage stored on the capacitor 18, thereby it being made possible to simplify the structure of circuitry.

The reset switch 9, sampling switch 15 and inverse integration start switch 20 used in the embodiment of the invention can take the form of semi-conductor switches (such as field effect transistors) so that they are fabricated into an IC along with the other parts as is known per se. It is also to be noted that though, in the embodiments of FIGS. 1 and 4, an input analog voltage is multiplied by the window function, it is not always necessary to do so provided that the input analog voltage is continuous.

Also in the embodiment of FIG. 1, for the purpose of generating the inverse integration current there is provide a counter arranged to start counting when an iverse integrating operation is initiated so that in combination with a D/A converter for the number of counts of said counter. In order to obtain an output in digital form corresponding to the cube root of the input analog signal, the designer needs only to modify such inverse integration current so that the amount of inverse-integrated charge increases as a cube function of the inverse integration period. For this purpose, there may be provided a circuit for squaring the output signal of the D/A converter 12 of the embodiment shown in FIG. 1 between the A point and the resistor 21 of FIG. 1.

By the analogy of this, the n-th root can be produced at the output in the digital form by altering that inverse integration current so that the amount of inverse-integrated charge increases as an n-th power function of the inverse integration period. For this purpose there is need similarly only to use an additional circuit for producing an output representing the n-th power of the output signal of the D/A converter 12 of the embodiment shown in FIG. 1 between the A point and the resistor 21 of FIG. 1.

As has been described in greater detail above, according to the present invention, as the output of the inverse integration signal generating means in the prior known A/D converter using the dual-slope integration circuit use is made of a current of which the intensity varies so that the inverse-integrated signal amount increases as almost square a function of the inverse integration period for obtaining an output in digital form almost equal to the square root of the input analog value, with an advantage that the structure of the circuitry can be simplified. Another advantage arising from the simultaneous occurrence of the compressing operation with the A/D converting one is that as compared with the prior art in which the compressing is peformed by the digital computation, the time necessary to accomplish the A/D conversion can be shortened and the dynamic range can be widened.

What we claim is:

1. A compression type A/D converter comprising:
   (a) input analog signal transmitting means for transmitting an input analog signal;
   (b) an integrator;
   (c) inverse integration signal generating means for generating an inverse-integrated signal which increases as as a function of a polynomial of order n (where $n \neq 1$) of the inverse integration period;
   (d) switching means for connecting said input analog signal transmitting means to said integrator for a predetermined time to effect integrating by said integrator for the predetermined time and then connecting said inverse integration signal generating means with said integrator; and
   (e) means for converting the time interval from a moment at which said inverse integration signal generating means is connected with said integrator by said switching means to a moment at which the integrated value by said integrator reaches a predetermined level to a digital value.

2. A compression type A/D converter according to claim 1, wherein said inverse integration signal generating means includes:
   (a) a counter arranged to start counting when said inverse integration signal generating means is connected with said integration circuit by said switching means; and
   (b) means receptive of the output of said counter for producing an output after digital-to-analog conversion.

3. A compression type A/D converter according to claim 1, wherein said inverse integration signal generating means includes:
   means for producing an output signal proportional to the square root of the integrated value produced from said integrator.

4. A compression type A/D converter comprising:
   (a) input analog signal transmitting means for transmitting an input analog signal;
   (b) an integrator;
   (c) inverse integration signal generating means for generating an inverse-integrated signal which increases as a function of a polynomial of order n (where $n \neq 1$) of the inverse integration period;
   (d) switching means for connecting said input analog signal transmitting means to said integrator for a predetermined time to effect integrating by said integrator for the predetermined time and then connecting said inverse integration signal generating means with said integrator; and
   (e) means for converting the time interval from a moment at which said inverse integration signal generating means is connected with said integrator by said switching means to a moment at which the integrated value by said integrator reaches a predetermined level to a digital value.

* * * * *